United States Patent
Chow et al.

(10) Patent No.: US 6,198,317 B1
(45) Date of Patent: Mar. 6, 2001

(54) FREQUENCY MULTIPLICATION CIRCUIT

(75) Inventors: Hwang-Cherng Chow, Chutung; Yuan-Hua Chu; Chi-Chang Shuai, both of Taipei, all of (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/393,232

(22) Filed: Sep. 9, 1999

Related U.S. Application Data (62) Division of application No. 09/026,843, filed on Feb. 20, 1998, now abandoned.

(51) Int. Cl.$^7$ .................................................. H03B 19/00
(52) U.S. Cl. ........................ 327/116; 327/122; 327/119
(58) Field of Search .................................. 327/113, 116, 327/119, 120, 121, 122

(56) References Cited

U.S. PATENT DOCUMENTS

| | | | |
|---|---|---|---|
| 3,974,501 | * 8/1976 | Ritzie ..................... | 343/14 |
| 4,479,216 | 10/1984 | Krambeck et al. ............ | 371/61 |
| 4,831,343 | 5/1989 | Baron ....................... | 331/116 R |
| 5,061,907 | 10/1991 | Rasmussen .................. | 331/57 |
| 5,081,428 | 1/1992 | Atriss et al. ............... | 331/57 |
| 5,107,264 | * 4/1992 | Novof ....................... | 341/101 |
| 5,926,053 | * 7/1999 | McDermott et al. ............ | 327/298 |
| 6,060,922 | * 5/2000 | Chow et al. ................. | 327/175 |

FOREIGN PATENT DOCUMENTS

| | | | |
|---|---|---|---|
| 403102909A | * 4/1991 | (JP) ....................... | 327/116 |

* cited by examiner

*Primary Examiner*—Tuan T. Lam
*Assistant Examiner*—Hiep Nguyen
(74) *Attorney, Agent, or Firm*—Proskauer Rose LLP

(57) ABSTRACT

An N times frequency multiplication circuit uses duty cycle control buffers in combination with edge detectors to provide both multiplication and 50% duty cycle adjustment. Parallel branches of duty cycle control buffers are preset for respective duty cycles of 1/N, 2/N,...,N−1/N. The buffers each receive a common edge detected input signal and simultaneously output their respective duty cycle adjusted clock signals. A rising and falling edge detector generates a pulse train at double the frequency of the 1/N buffer output, while falling edge detectors generate time spaced pulse trains from the outputs of their respective 2/N,...,N−1/N buffers. These pulse trains are combined in an OR gate to provide an output pulse train at a frequency N times the input clock frequency fin. A final stage duty cycle control buffer adjusts the N times fin output signal to a 50% duty cycle.

4 Claims, 12 Drawing Sheets

FREQUENCY MULTIPLICATION CIRCUIT

This application is a divisional of U.S. Ser. No. 09/026,843, filed Feb. 20, 1998, now abandoned.

RELATED APPLICATION

This invention is related to U.S. patent application Ser. No. 09/026,842, entitled "Duty Cycle Control Buffer Circuit with Selective Frequency Dividing Function", filed on Feb. 20, 1998 for Hwang-Cherng Chow et al. The contents of the above-noted application is incorporated herein by reference.

FIELD OF THE INVENTION

The present invention relates generally to CMOS integrated circuits. More particularly, it relates to a frequency multiplication circuit which makes use of duty cycle control buffers.

BACKGROUND OF THE INVENTION

Figure 1:
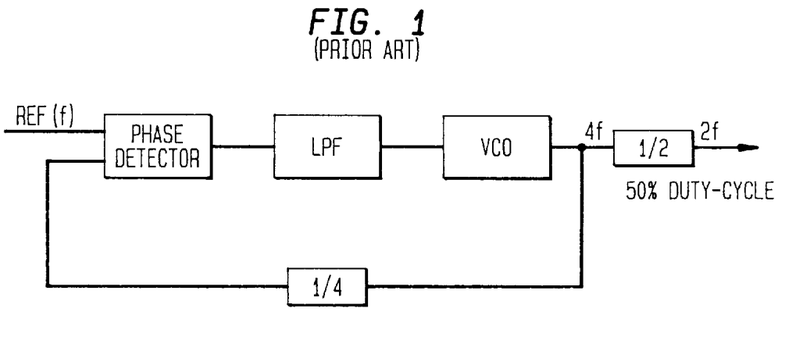
FIG. 1 is a first prior art phase-locked loop (PLL) frequency doubler circuit.

Phase-locked loop (PLL) circuits are well known and are often used for frequency multiplication purposes. The main components of a PLL circuit, as shown in FIG. 1, comprise a phase detector/comparator, a loop filter (LPF), and a voltage-controlled oscillator (VCO). Typically, a PLL circuit is designed to generate an output clock signal at twice the frequency (2f) of an input clock signal (f). However, it is also generally desirable for a clock signal to have a 50% duty cycle (symmetrical square wave). In order to ensure a 50 percent duty cycle for the output clock signal (2f) in the PLL circuit of FIG. 1, the VCO is operated at 4 times f, and a divide-by-2 counter is used to provide the 2f output at a 50% duty cycle. In addition, a divide-by-4 counter is needed in the feedback loop to provide a correct frequency comparison with the input clock f in the phase detector. While this PLL design approach offers flexibility for frequency multiplication, it does have at least two significant disadvantages:

(1) increased power consumption due to the VCO operation at 4X frequency; and (2) complex analog design of the VCO circuit, including techniques for reducing power noise and frequency jitter.

Various types of improved VCO circuits have been disclosed in the prior art. For example, in U.S. Pat. No. 5,061,907 issued to R. R. Rasmussen, a multi-stage ring oscillator with ring trip-point compensation is used to control the duty cycle of the VCO output.

Figure 2:
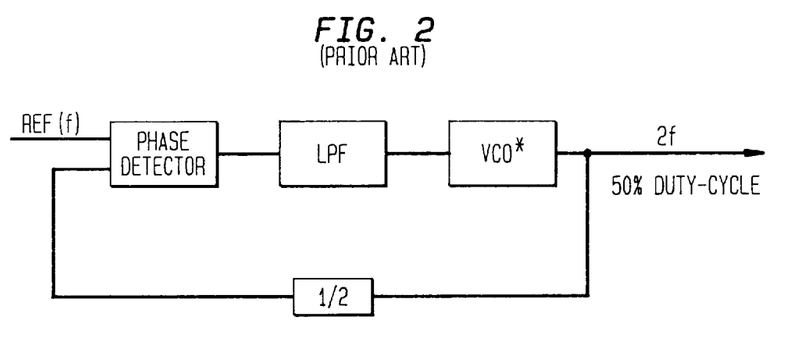
FIG. 2 is a second prior art phase-locked loop (PLL) frequency doubler circuit.

In U.S. Pat. No. 5,081,428 issued to A. H. Atriss et al., a VCO circuit is disclosed which uses current mirrors to generate a 50 percent duty cycle output which is derived directly from the VCO frequency. Therefore, there is no need to operate the VCO at 4 times the frequency of the input clock signal, as in the prior art circuit shown in FIG. 1. This improved VCO can be used in a 2X PLL circuit as shown in FIG. 2. While the operating frequency of this VCO circuit has been reduced to half the frequency of the prior art circuit shown in FIG. 1, the VCO circuit design is complex and challenging.

Figure 3:
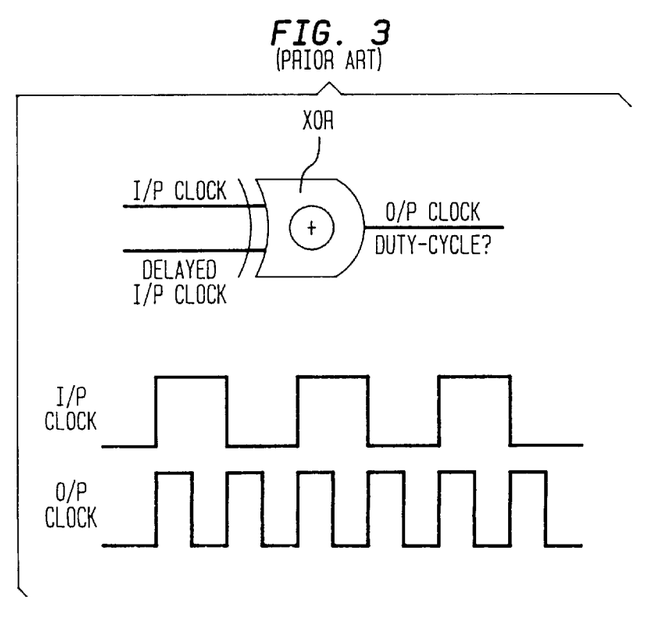
FIG. 3 is a third prior art frequency doubler (XOR gate).

Another prior art method for doubling the incoming clock frequency is through the use of an exclusive OR (XOR) gate, as shown in FIG. 3. An incoming clock signal is connected to the first input of the XOR gate, and is also connected to the second input through a delay element. If the input clock has a 50% duty cycle, the output will be a clock at twice the input frequency. However, the duty cycle of this output frequency can vary between 20 percent and 80 percent. For example, if the delay element provides a nominal delay of 40 percent of the output clock period, the process variations in manufacturing the delay element can result in a delay which is as small as one half (20%), or as large as two times (80%), the nominal 40 percent delay. A 20 percent worst case duty cycle clock is unacceptable for most applications, and effectively prohibits further multiplication. Therefore, there is still a need for a simplified and improved circuit and method for frequency multiplication, with an equalized (50%) duty cycle output.

Accordingly, it is an object of the present invention to overcome the disadvantages of the prior art, and to provide a simplified frequency multiplication circuit with a stable 50% duty cycle output.

SUMMARY OF THE INVENTION

In accordance with an illustrative embodiment of the present invention, a circuit for N times frequency multiplication and 50% duty cycle equalization of an unpredictable input clock signal has a rising or falling edge detector as an input stage. An input clock signal at a frequency fin is edge detected by this detector, which outputs a one shot pulse signal for each transition cycle of the input clock signal. The one shot pulse signals make up a pulse train at a frequency equal to fin, but with a duty cycle much less than 50%.

The one shot pulse train is inputted in parallel to a quantity N−1 first-stage duty cycle control buffers, where N is an integer>=2. The first-stage duty cycle control buffers are arranged in parallel branches, with preset duty cycles equal to 1/N, 2/N,...,N−1/N, respectively. Thus, the one shot pulse train is duty cycle adjusted simultaneously in each parallel branch, with the number of branches depending on the value of N.

The output signal from the first-stage duty cycle control buffer, having a duty cycle equal to 1/N, is inputted to a rising and falling edge detector. This detector outputs a one shot pulse signal for each transition edge of the 1/N duty cycle signal, such that the one shot pulse signals outputted from the rising and falling edge detector occur at a frequency equal to twice that of the input signal frequency (2fin).

If N>2, there will be one or more additional first-stage duty cycle control buffers, with their duty cycle adjusted outputs each connected to a corresponding falling edge detector. Each falling edge detector outputs a one shot pulse signal for each transition cycle of its respective 2/N,...,N−1/N duty cycle adjusted input. The one shot pulse signals are therefore outputted from the falling edge detectors at the same frequency fin as that of the input signal, but are spaced in time according to the duty cycle of their respective input.

An OR gate receives the 2fin output signal from the rising and falling edge detector, and, when N>2, also receives the output signals from the N−2 falling edge detectors. The OR gate outputs a pulse train combining all the inputted edge detected signals, such that the OR gate output signal frequency is equal to N times the input frequency fin.

A second-stage 50% duty cycle control buffer receives the OR gate output signal at frequency N times fin, and adjusts its duty cycle to 50%, at frequency N times fin.

Where an input clock signal has a predictable 50% duty cycle, a circuit for 2N times frequency multiplication is readily achievable by modifying the above described circuit. All that is required is the replacement of the input stage rising or falling edge detector with an input stage rising and falling edge detector. In this case, the input stage rising and falling edge detector receives the 50% duty cycle input clock signal at a frequency fin, and outputs a one shot pulse signal for each transition edge of the input clock signal. The output one shot pulse signals make up a pulse train at a frequency equal to 2 times fin, with a duty cycle less than 50%. The remainder of the circuit functions in exactly the same manner as described above, with the final output frequency at 2N times fin, and at a 50% duty cycle.

An illustrative embodiment of the present invention is more fully described below in conjunction with the following drawings.

DETAILED DESCRIPTION OF THE INVENTION

Figure 4:
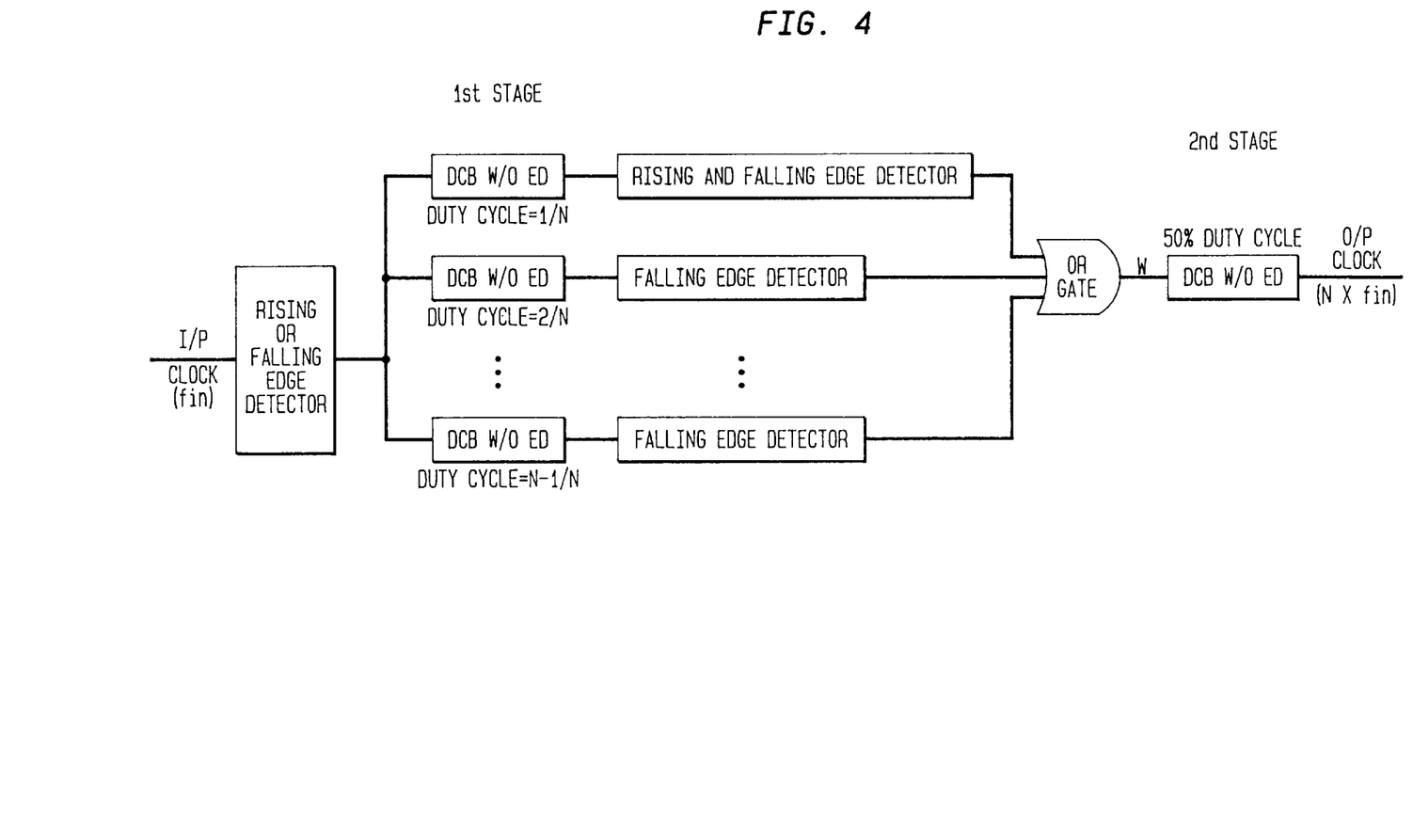
FIG. 4 is a first preferred embodiment of the inventive frequency multiplication circuit.

FIG. 4 shows the general configuration of a first preferred embodiment of the present invention, which is an N times frequency multiplication circuit, where N is an integer>=2. According to this embodiment, N duty cycle control buffers without edge detectors (DCB w/o ED) are required, with their respective duty cycles preset at 1/N, 2/N,..., N−1/N, and ½ (50%), respectively. A rising edge detector (or falling edge detector) is used to detect the transitions of the incoming input clock signal (fin). The particular edge detector used outputs positive-going one shot pulse train signals or notch-like negative-going one shot pulse train signals, which are simultaneously applied to the first stage duty cycle buffers. Each of the first stage duty cycle buffers adjusts the pulse width of its incoming one shot pulse train, so as to output a rectangular pulse signal with a duty cycle equal to the buffer's preset value (1/N, etc.). The 1/N duty cycle adjusted buffer output is then edge detected by a rising and falling edge detector, while the 2/N, etc. duty cycle adjusted buffer outputs are edge detected by their respective falling edge detectors. All of these detected edges are OR'ed together to provide an output signal W from the OR gate having a frequency equal to N X fin. Finally, signal W triggers the operation of the 50% duty cycle buffer, which outputs a clock signal with a frequency equal to N X fin, and with a 50 percent duty cycle.

Figure 5:
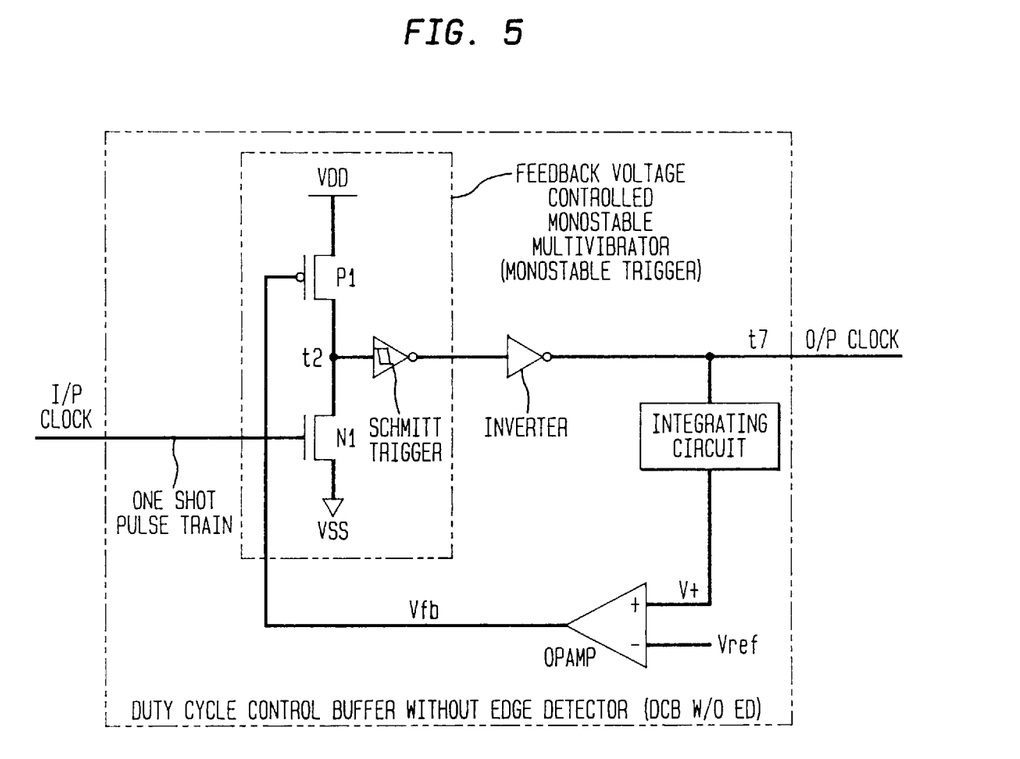
FIG. 5 is an embodiment of the duty cycle control buffer without edge detector used in FIG. 4.

FIG. 5 shows one embodiment of a duty cycle control buffer without edge detector circuit, in accordance with the present invention. The basic operation of each functional block within FIG. 5 is summarized below:

(1) feedback voltage controlled monostable multivibrator (monostable trigger)

This functional block generates an output signal whenever it is triggered by the one shot pulse train input. The pulse width of the outputted signal is controlled by the feedback voltage Vfb, in conjunction with PMOS P1 and the Schmitt trigger circuit. Alternately, an inverter can be used in place of the Schmitt trigger.

(2) inverter

This functional block inverts the monostable output signal in order to output a clock signal whose duty cycle is the complement of the duty cycle of the monostable output signal.

(3) integrating circuit

This functional block integrates the inverter output signal, and outputs the average voltage (V+) of this integrated signal to the positive input of the operational amplifier (OPAMP).

(4) OPAMP

This functional block may be a high gain operational amplifier or differential amplifier, with the negative input receiving a predetermined reference voltage (Vref). The output of this OPAMP is a control voltage (Vfb), proportional to the difference between V+ and Vref, which is fed back to the monostable trigger circuit to adjust the turn-on strength of PMOS P1. If a duty cycle of 50% is desired, Vref is set equal to VDD/2.

The above described functional blocks 1, 2, 3 and 4 comprise a duty cycle buffer circuit, in accordance with the present invention. In brief, this duty cycle control buffer automatically adjusts the duty cycle of an input clock signal via a closed loop function. The desired duty cycle value is determined by the reference voltage Vref. The operating characteristics of the inventive duty cycle control buffer are more fully described below.

To illustrate the operation of the duty cycle control buffer, two examples will be used: (1) the duty cycle is greater than desired, and (2) the duty cycle is less than desired.

(1) If the duty cycle is greater than desired, the average voltage (V+) derived from the output clock signal by the integrating circuit will be larger than the reference voltage Vref. When the average voltage V+ from the integrating circuit is larger than Vref, the OPAMP will output a feedback control voltage (Vfb) with increased amplitude. The increase in Vfb at the gate of PMOS P1 will have the effect of decreasing the turn-on strength of PMOS P1. Therefore, the voltage level at node t2 will be pulled up to VDD more slowly. As a result, the output signal from the monostable trigger circuit will have an increased pulse width. This signal is then inverted, so that the resultant output signal at node t7 has a narrowed pulse width. Therefore, the average voltage V+, which is derived from the output clock signal by the integrating circuit, will decrease until the desired duty cycle is achieved (steady-state), as determined by the value of the reference voltage Vref.

(2) If the duty cycle is less than desired, the average voltage V+ derived from the output clock signal by the integrating circuit will be less than the reference voltage Vref. When the average voltage V+ from the integrating circuit is less than Vref, the output control voltage Vfb will decrease in amplitude. This will have the effect of increasing the turn-on strength of PMOS P1. Therefore, the voltage level at node t2 will be pulled up to VDD more quickly. As a result, the output signal from the monostable trigger circuit will have a decreased pulse width. This output signal is then complemented by the inverter, such that the resultant output signal at node t7 has an increased pulse width. Thus, the average voltage V+, which is derived from the output clock signal by the integrating circuit, will increase until the desired duty cycle is achieved (steady-state), as determined by the value of the reference voltage Vref.

Since the inventive duty cycle control buffer utilizes a closed loop with negative feedback, the loop function will be stable under steady-state conditions. When the closed loop reaches its steady-state condition, the duty cycle will be equivalent to the value predetermined by Vref.

Alternate embodiments of the above described duty cycle control buffer circuit can be found in related U.S. patent application Ser. No. 09/026,842, entitled "DUTY CYCLE CONTROL BUFFER CIRCUIT WITH SELECTIVE FREQUENCY DIVIDING FUNCTION". Additional implementations of monostable triggers can also be found in the same patent application.

To illustrate the frequency multiplying and duty cycle control processes of the present invention, two examples will be described below: (1) a frequency doubler (2X); and (2) a frequency tripler (3X).

Figure 6A:
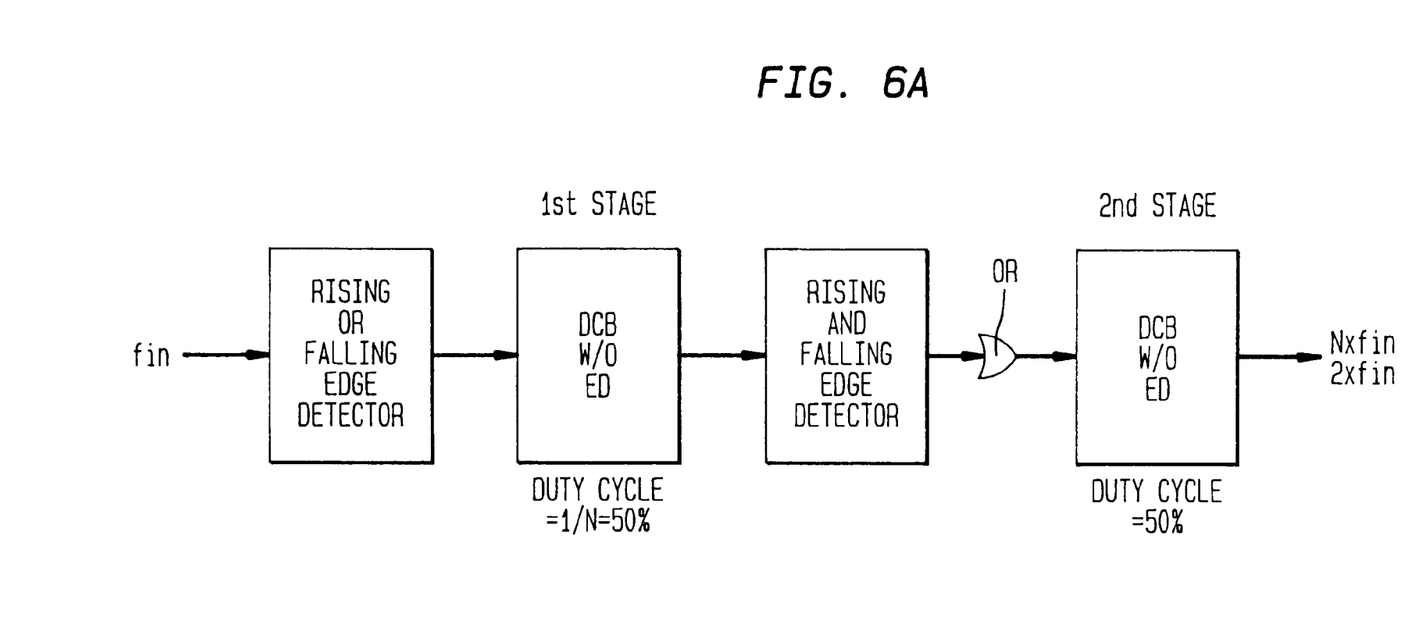
FIG. 6a shows the block diagram of a X2 frequency multiplier, according to the invention.
Figure 6B:
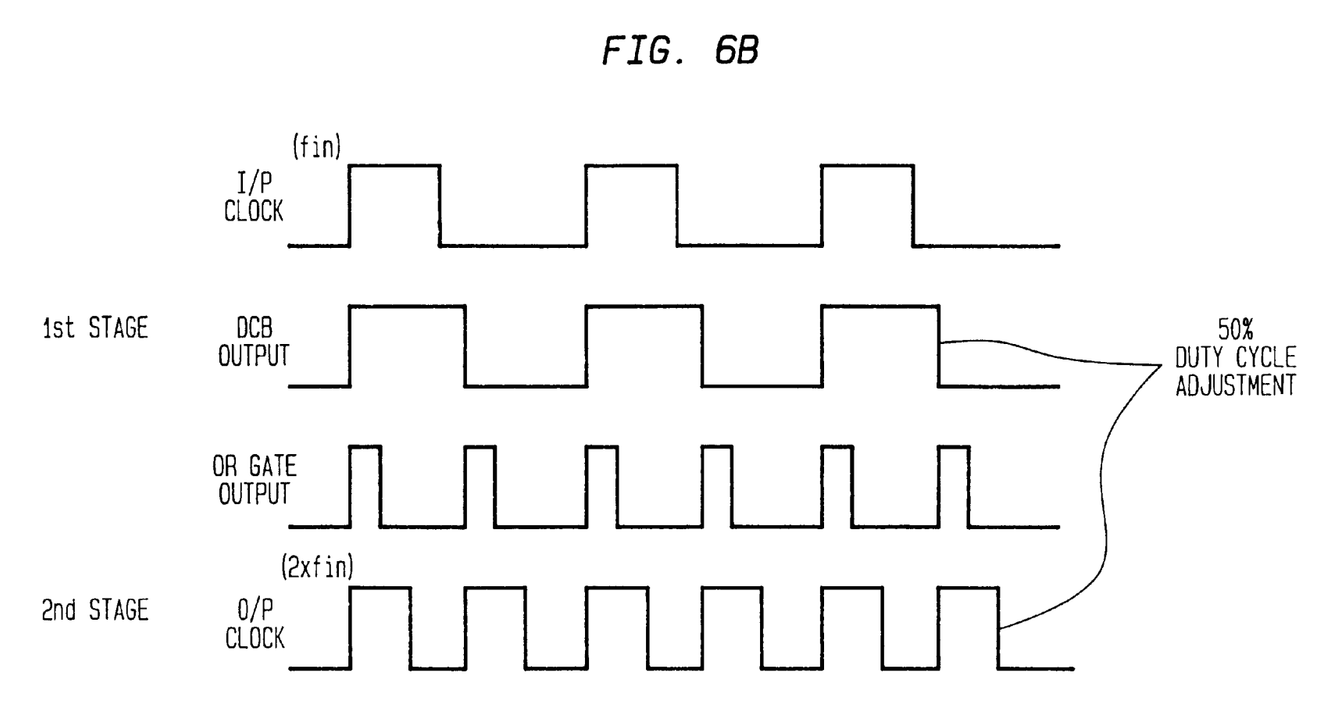
FIG. 6b shows the timing diagrams for the X2 frequency multiplier.

(1) A block diagram of a 2X circuit is shown in FIG. 6a, in accordance with the present invention. The number of duty cycle buffers required is 2, since N=2, as described above in reference to FIG. 4. An input clock signal (fin) with an unpredictable duty cycle is inputted to a rising (or falling) edge detector. The edge detector converts the positive-going transitions (rising), or negative-going transitions (falling), to a one shot output pulse train. Importantly, the one shot output pulse train is at the same frequency as the input clock fin, but the one shot pulse train duty cycle is much less than 50%. The first-stage duty cycle buffer receives the one shot pulse train and adjusts its duty cycle to 1/N, or 50% in this case, since N=2. The output of the first-stage duty cycle buffer is then edge detected by the rising and falling edge detector, so that the number of detected transition edges is twice the frequency of the incoming 50% duty cycle signal. The detected edges are then transferred by the OR gate, to output a 2Xfin frequency pulse train. Finally, the 2Xfin signal is duty cycle adjusted in the second-stage duty cycle buffer, to restore its 50% duty cycle. Thus, the output of the second stage duty cycle buffer is a 50% duty cycle clock signal at a frequency of NXfin, or 2Xfin, since N=2. FIG. 6b shows the timing diagrams of the above described 2X frequency multiplier circuit.

Figure 7A:
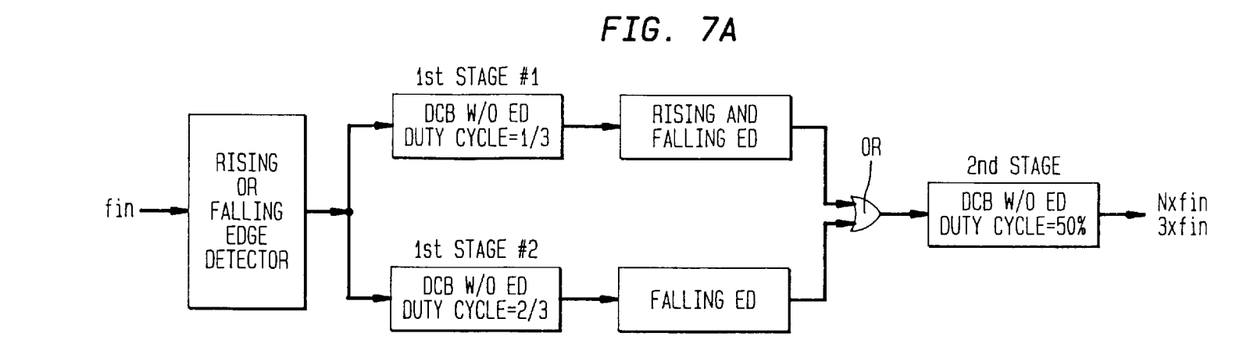
FIG. 7a shows the block diagram of a X3 frequency multiplier, according to the invention.
Figure 7B:
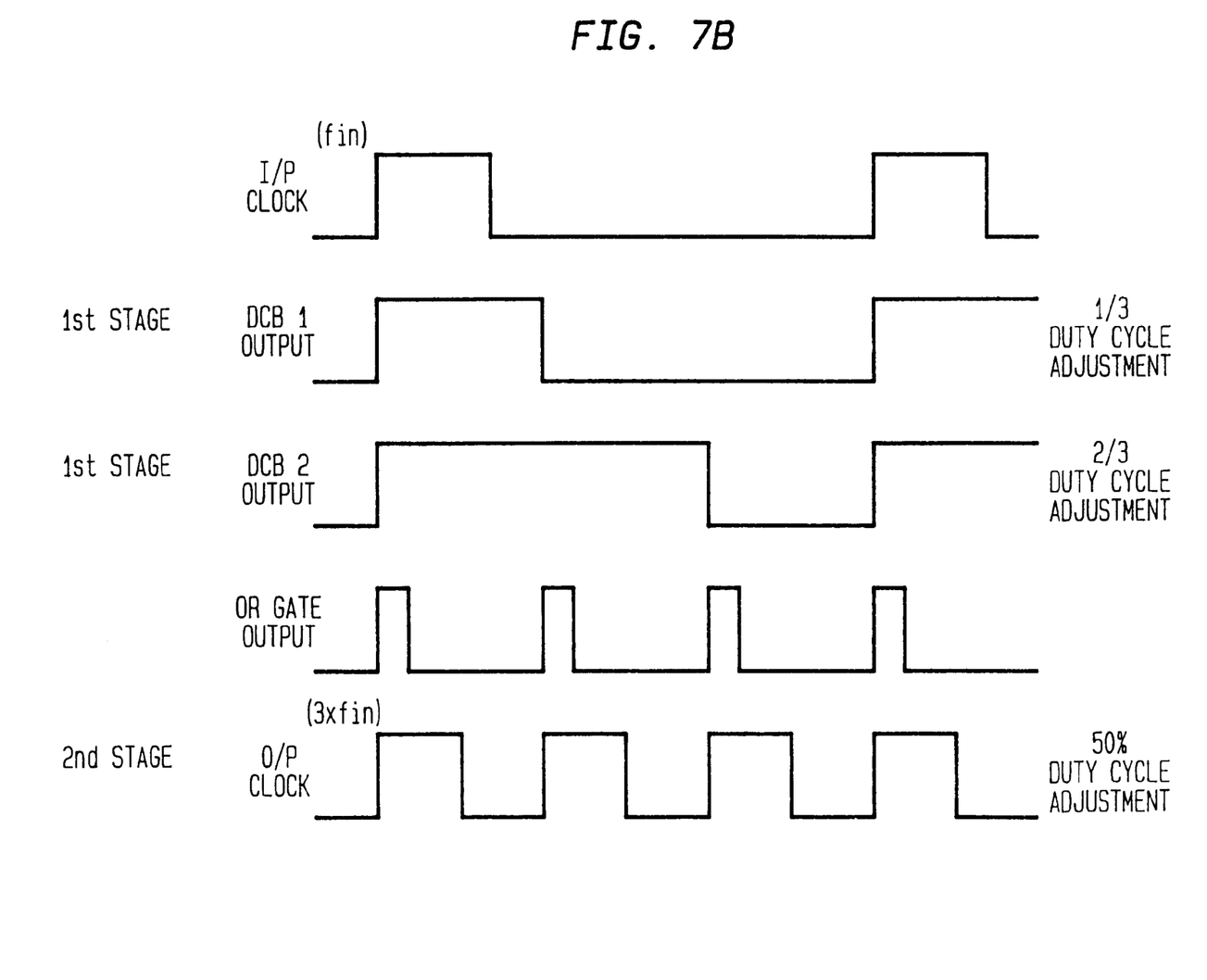
FIG. 7b shows the timing diagrams for the X3 frequency multiplier.

(2) A block diagram of a 3X circuit is shown in FIG. 7a, in accordance with the present invention. The number of duty cycle buffers required is 3, since N=3, as described above in reference to FIG. 4. An input clock signal (fin) with an unpredictable duty cycle is inputted to a rising (or falling) edge detector. The edge detector converts the positive-going transitions (rising), or negative-going transitions, (falling) to a one shot output pulse train. Importantly, the one shot output pulse train is at the same frequency as the input clock fin, but the one shot pulse train duty cycle is much less than 50%. The first-stage duty cycle buffer #1 receives the one shot pulse train and adjusts its duty cycle to 1/N, or ⅓ in this case, since N=3. The first-stage duty cycle buffer #2 also receives the one shot pulse train and adjusts its duty cycle to 2/N, or ⅔ in this case, since N=3. The output of the first-stage duty cycle buffer #1 is then edge detected by the rising and falling edge detector, so that the number of detected transition edges is twice the frequency of the incoming ⅓ duty cycle signal. The output of the first-stage duty cycle buffer #2 is edge detected by the falling edge detector, so that the number of detected transition edges is equal to the frequency of the incoming ⅔ duty cycle signal, and also displaced in time from the detected edges of the rising and falling edge detector. The detected edge outputs of the rising and falling edge detector and the falling edge detector are then combined in the OR gate, to produce a 3Xfin frequency pulse train. Finally, the 3Xfin signal is duty cycle adjusted in the second-stage duty cycle buffer, to a 50% duty cycle. Thus, the output of the second-stage duty cycle buffer is a 50% duty cycle clock signal at a frequency of NXfin, or 3Xfin, since N=3. FIG. 7b shows the timing diagrams of the above described 3X frequency multiplier circuit.

Figure 8:
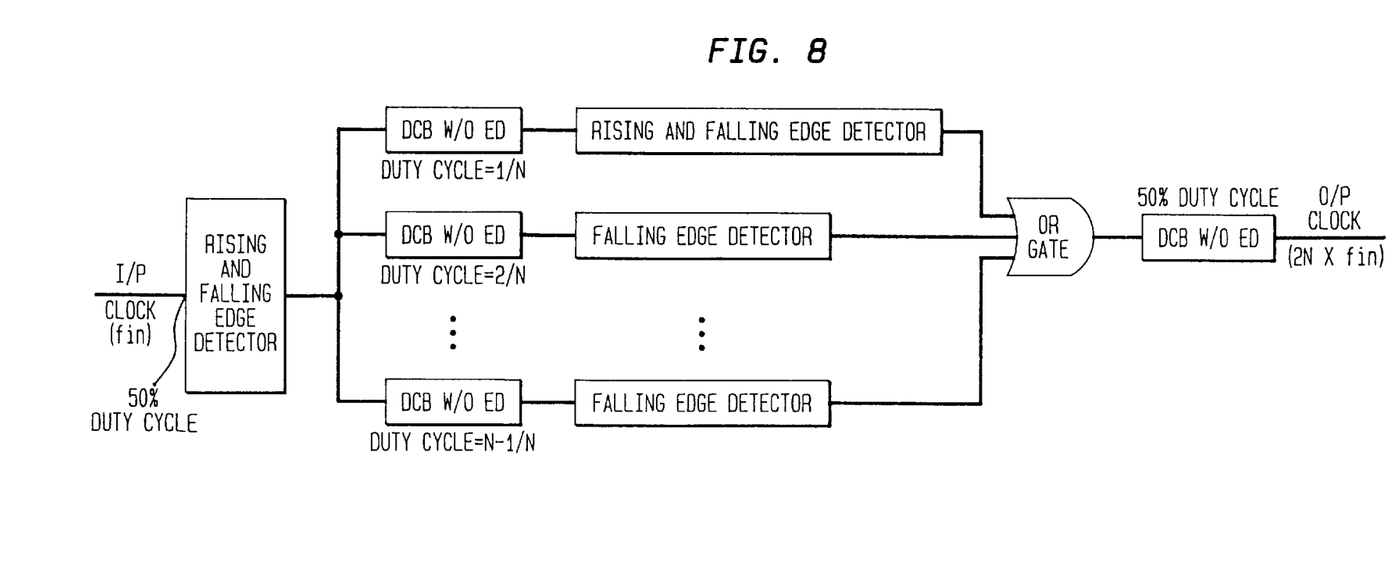
FIG. 8 is a second preferred embodiment of the inventive frequency multiplication circuit.

A second preferred embodiment of the present invention is shown in FIG. 8, where the input clock signal (fin) is a symmetrical square wave; that is, with a 50% duty cycle. In this situation, 2N times frequency multiplication is readily achieved through the use of a rising and falling edge detector at the input stage, instead of the rising or falling edge detector of FIGS. 4, 6a, and 7a. Since the output of this first rising and falling edge detector results in a one shot pulse train signal at two times the input frequency fin, the final output clock is 2N times the frequency multiplication factor of the entire circuit, or 2N X fin.

Figure 9:
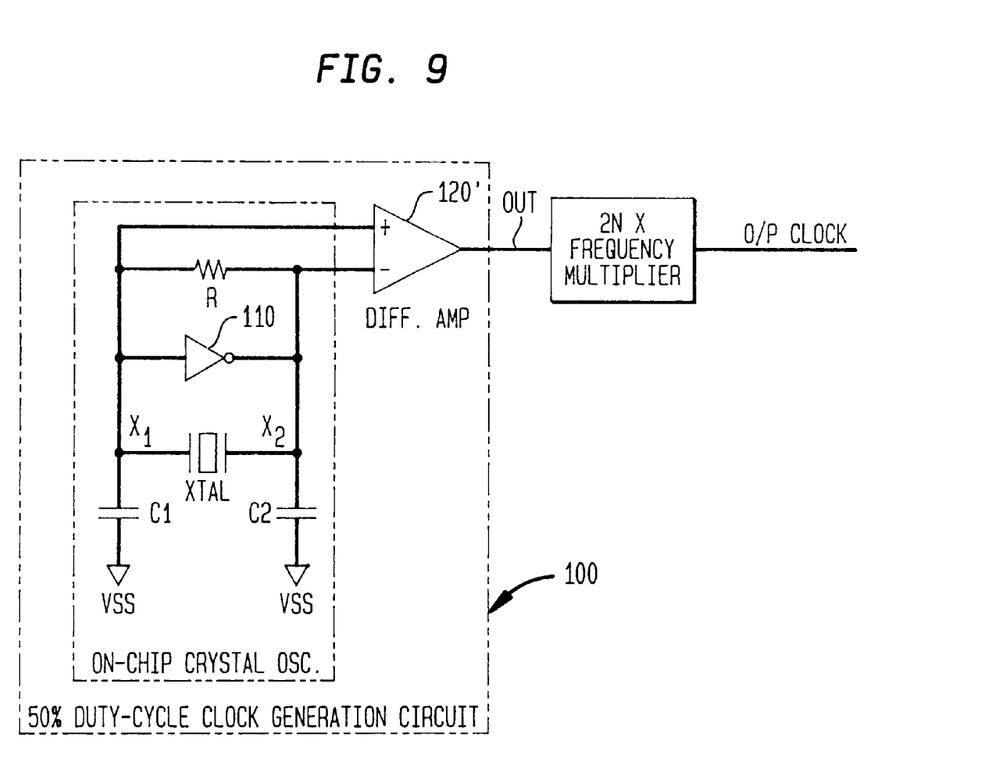
FIG. 9 is an alternate preferred embodiment of a frequency multiplication circuit, in accordance with the present invention.

A 50 percent duty cycle clock generation circuit 100 is shown in FIG. 9, which makes use of an on-chip crystal oscillator (XTAL) to generate the input clock signal. The on-chip clock generation circuit also includes loading capacitors C1 and C2, and a self-biased amplifier, consisting of resistor R and inverter 110. The oscillating signal at node X1 is a sinusoidal waveform, at a frequency equal to the crystal oscillator XTAL frequency. Loading capacitors C1 and C2 provide harmonic filtering, such that the waveform at node X1 is effectively a pure sine wave. The amplitude of this waveform depends on the crystal XTAL frequency, the values of loading capacitors C1 and C2, the gain of self-biased amplifier R, inverter 110, and the circuit operating voltages. In the inventive circuit, the gain of the self-biased amplifier is made large enough to cause its output signal, at node X2, to achieve a square wave shape. The sinusoidal signal at X1 and the square wave signal at X2, which are out of phase with each other, are applied to the positive and negative input terminals of a differential amplifier 120, respectively. As a result, differential amplifier 120 generates a clock signal at node OUT, having the same frequency as the crystal oscillator XTAL, and with an approximate 50 percent duty cycle. Where a more precise 50 percent duty cycle output signal is required, a two-stage differential amplifier design can be incorporated.

Figure 9A:
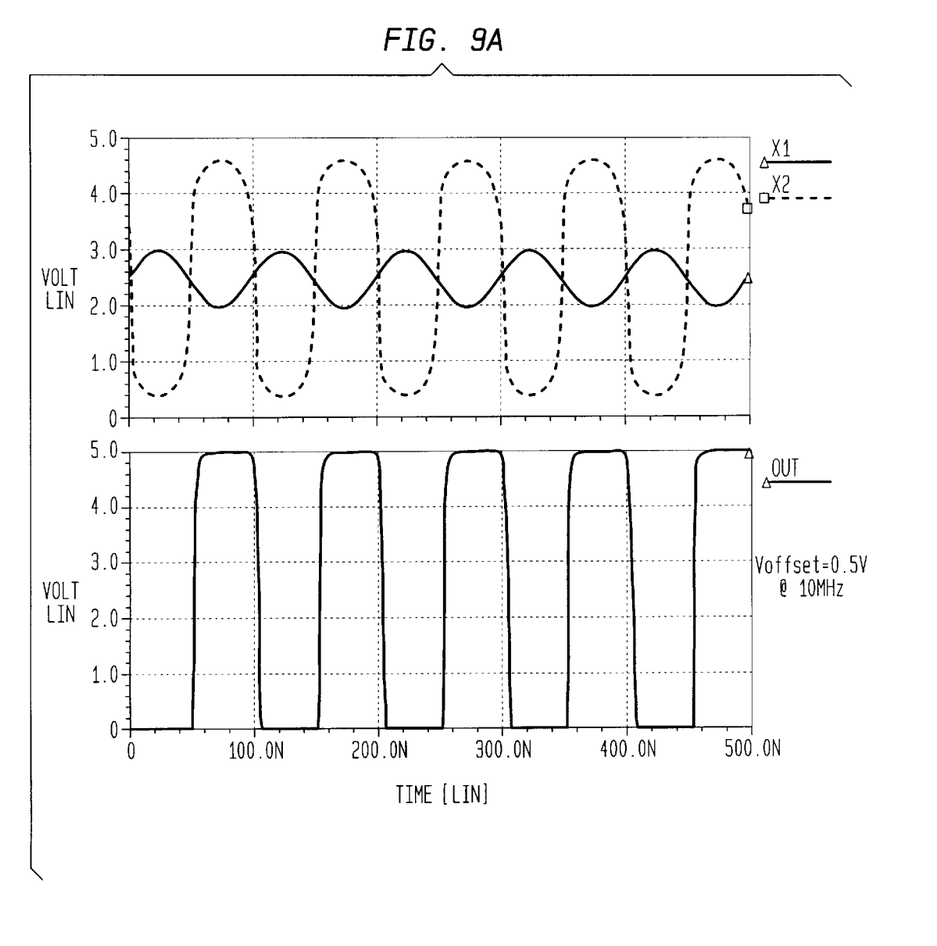
FIGS. 9a–c show simulated results of the signals at nodes X1, X2 and OUT for the frequency multiplication circuit of FIG. 9.
Figure 9B:
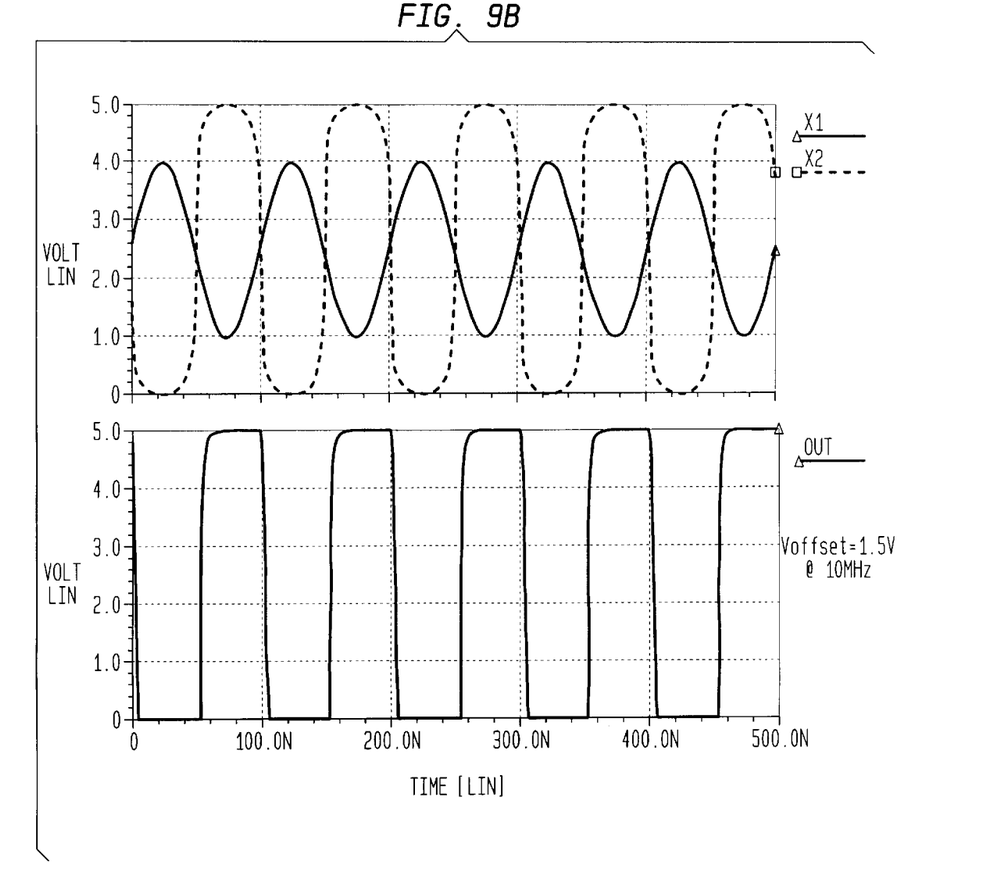
Figure 9C:
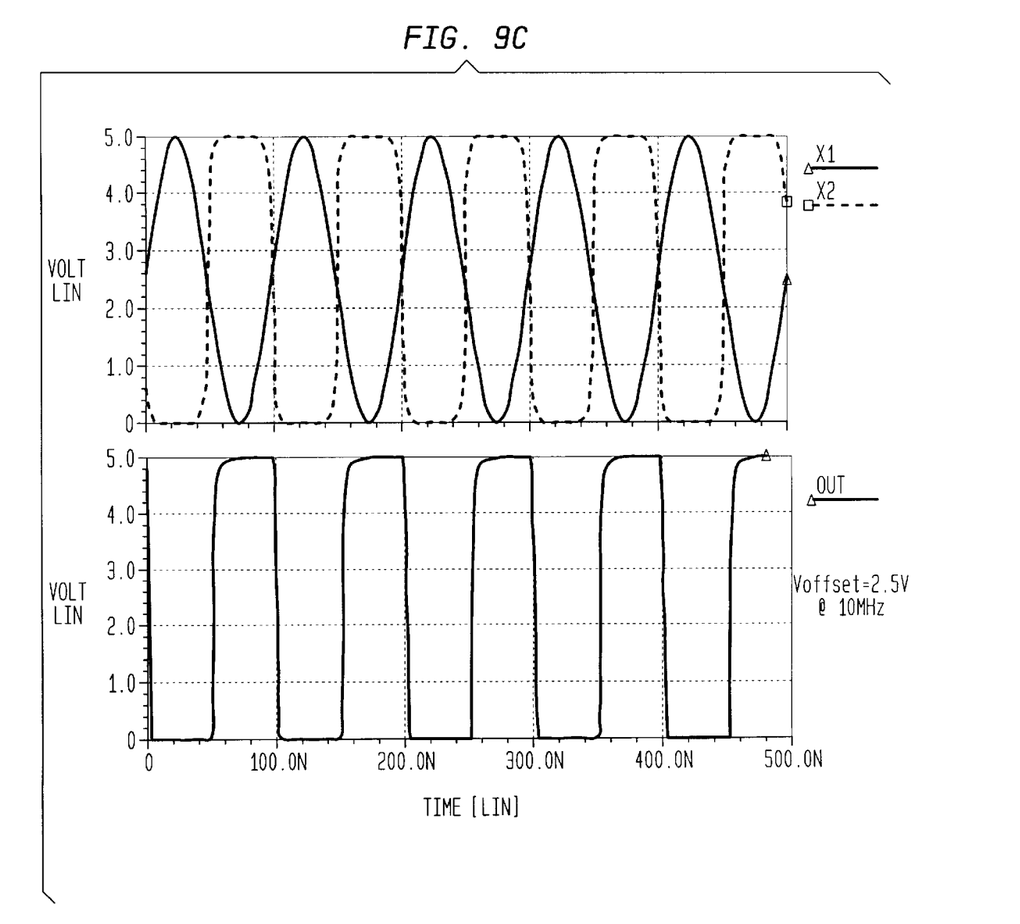

Simulated results of the above described clock circuit 100 are illustrated by the waveforms in FIGS. 9a, 9b, and 9c. FIG. 9a shows the signals at nodes X1, X2, and OUT, at a Voffset equal to 0.5 volt and a frequency of 10 Mhz. Voffset represents the amplitude of the signal at node X1. FIGS. 9b and 9c show analogous results for Voffsets of 1.5 volts and 2.5 volts, respectively.

Figure 10:
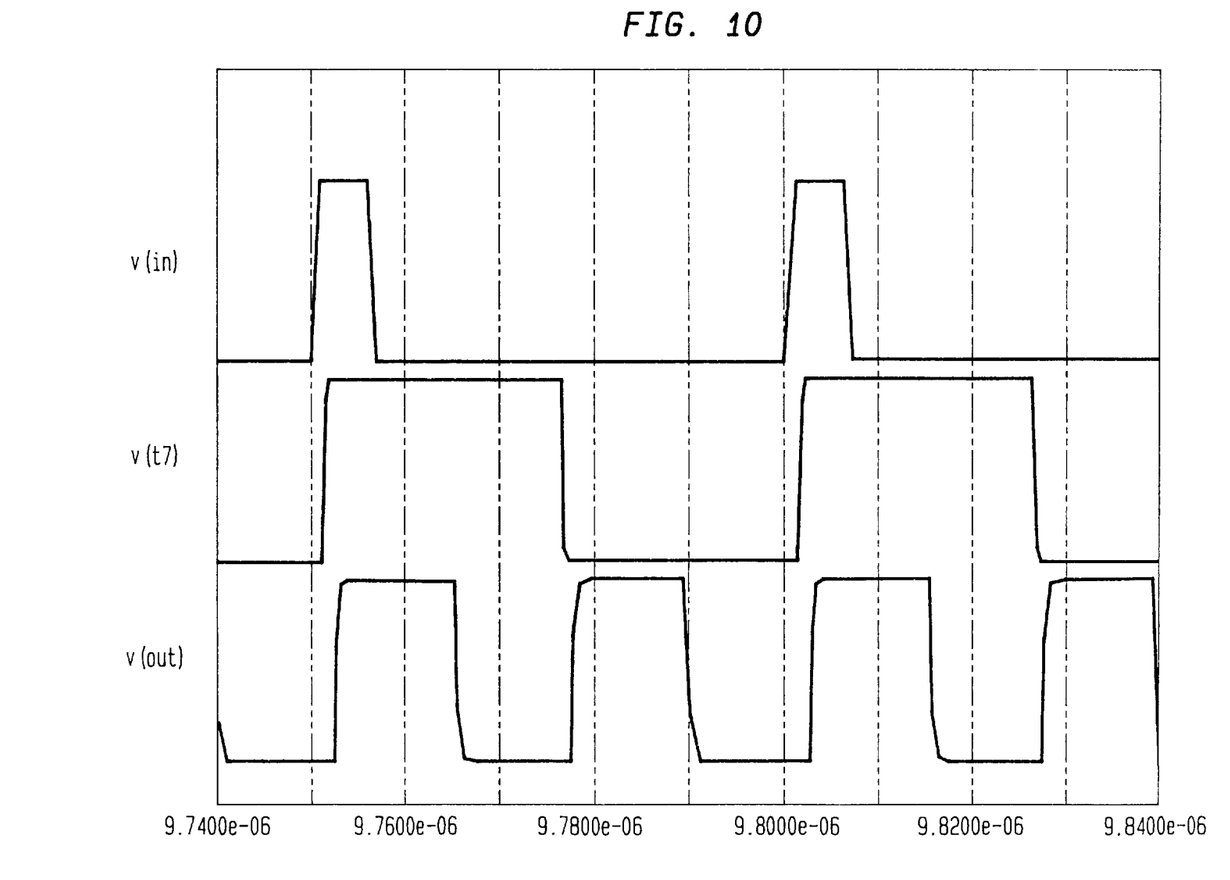
FIG. 10 shows the simulation test results of a frequency doubler with a 40 MHz output clock, in accordance with the invention.

Simulation test results of the inventive frequency doubler circuit (FIG. 6a) are shown in FIG. 10. In this simulation, the input clock signal v(in) has a frequency of 20 MHz. This input clock signal is first 50% duty cycle adjusted, as indicated by v(t7). This signal is then frequency multiplied by 2 to obtain the final 40 MHz output with 50% duty cycle, as represented by v(out). As shown in FIG. 6a, 2 duty cycle control buffer circuits are required for this 2X frequency multiplication at 50% duty cycle.

In short, a circuit for N times frequency multiplication and 50% duty cycle adjustment on an input clock signal is disclosed herein. Moreover, the disclosed circuit can be combined with a 2X frequency multiplier circuit to provide the dual functions of 2XN frequency multiplication and 50% duty cycle control.

The advantages of the disclosed invention over the prior art may be summarized as follows:

(1) less design complexity, as compared to the VCO design requirements of the PLL circuit;

(2) equalized duty cycle output, which makes additional frequency multiplication feasible; and (3) no jitter problem, since noise from the power/ground line only affects the one shot pulse train signals, but does not change their frequency.

The above described embodiments of the invention are intended to be illustrative only. Numerous alternative embodiments may be devised by those skilled in the art without departing from the spirit and scope of the following claims.

What is claimed is:

1. A circuit for N times frequency multiplication and 50% duty cycle equalization of an input clock signal, comprising:

an edge detector circuit, for receiving said input clock signal at a frequency fin, and for outputting a one shot pulse signal for each transition cycle of said input clock signal, said one shot pulse signals comprising a pulse train at a frequency equal to fin, with a duty cycle less than 50%, a quantity N−1 first-stage duty cycle control buffers, where N is an integer>=2, said first-stage duty cycle control buffers for simultaneously receiving said one shot pulse train from said edge detector circuit and for individually adjusting said one shot pulse train to the preset duty cycle values of said first-stage duty cycle control buffers, wherein said preset duty cycle values are 1/N, 2/N,...,N−1/N, respectively, a rising and falling edge detector, for receiving an output signal from said first-stage duty cycle control buffer having a duty cycle equal to 1/N, said rising and falling edge detector outputting a one shot pulse signal for each transition edge of said 1/N duty cycle signal, such that said one shot pulse signals outputted from said rising and falling edge detector occur at a frequency 2fin, equal to twice that of the input signal frequency fin, a quantity N−2 falling edge detectors, when N>2, each said falling edge detector for receiving an output signal from its corresponding said first-stage duty cycle control buffer having a duty cycle equal to 2/N,...,N−1/N, respectively, wherein each said falling edge detector outputs a one shot pulse signal for each transition cycle of said 2/N,...,N−1/N input signals, such that said one shot pulse signals outputted from said falling edge detectors occur at a frequency fin, equal to that of said input signal frequency, an OR gate, for receiving said output signal from said rising and falling edge detector, and, when N>2, for also receiving said output signals from said N−2 falling edge detectors, said OR gate for outputting a pulse train comprising all said edge detected signals, such that said OR gate output signal frequency is equal to N times said input frequency fin, a second-stage 50% duty cycle control buffer, for receiving said OR gate output signal at frequency N times fin, and for adjusting said OR gate output signal to a 50% duty cycle, at frequency N times fin.

2. A circuit for 2N times frequency multiplication of a 50% duty cycle input clock signal, comprising:

a first rising and falling edge detector circuit, for receiving said 50% duty cycle input clock signal at a frequency fin, and for outputting a one shot pulse signal for each transition edge of said input clock signal, such that said one shot pulse signals comprise a pulse train at a frequency equal to 2 times fin, with a duty cycle less than 50%, a quantity N−1 first-stage duty cycle control buffers, where N is an integer>=2, said first-stage duty cycle control buffers for simultaneously receiving said one shot pulse train from said first rising and falling edge detector circuit and for individually adjusting said one shot pulse train to the preset duty cycle values of said first-stage duty cycle control buffers, wherein said preset duty cycle values are 1/N, 2/N,...,N−1/N, respectively, a second rising and falling edge detector, for receiving an output signal from said first-stage duty cycle control buffer having a duty cycle equal to 1/N, said second rising and falling edge detector outputting a one shot pulse signal for each transition edge of said 1/N signal, such that said one shot pulse signals outputted from said second rising and falling edge detector occur at a frequency 4 times fin, equal to twice that of the signal frequency 2fin inputted to said second rising and falling edge detector, a quantity N−2 falling edge detectors, when N>2, each said falling edge detector for receiving an output signal from its corresponding said first-stage duty cycle control buffer having a duty cycle equal to 2/N,...,N−1/N, respectively, wherein each said falling edge detector outputs a one shot pulse signal for each transition cycle of said 2/N,...,N−1/N input signals, such that said one shot pulse signals outputted from said falling edge detectors occur at a frequency 2fin, equal to that of their respective input signal frequencies, an OR gate, for receiving said output signal from said second rising and falling edge detector, and, when N>2, for also receiving said output signals from said N−2 falling edge detectors, said OR gate for outputting a pulse train comprising all said edge detected signals, such that said OR gate output signal frequency is equal to N times said frequency 2fin into said first-stage duty cycle control buffers, a second-stage 50% duty cycle control buffer, for receiving said OR gate output signal at a frequency N times 2fin, and for adjusting said OR gate output signal to a 50% duty cycle at a frequency N times 2fin.

3. A method of N times frequency multiplication and 50% duty cycle equalization of an input clock signal, comprising the steps of:

a) detecting one transition per cycle of said input clock signal, and outputting therefrom a first pulse train equal in frequency to said input clock signal, but having a duty cycle less than 50%, b) splitting said first pulse train into N−1 branches, wherein the duty cycle of each said pulse train branch is adjusted to 1/N, 2/N,...,N−1/N, respectively, where N is an integer>=2, c) detecting each transition edge of said 1/N duty cycle branch, and outputting a second pulse train at a frequency equal to twice that of said 1/N duty cycle branch, d) for N>2, detecting one transition edge per cycle of said 2/N,...,N−1N duty cycle branches, and outputting a corresponding pulse train for each of said 2/N,...,N−1N duty cycle branches, each said corresponding pulse train having a frequency equal to that of said 2/N,..., N−1/N duty cycle branches, e) combining said second pulse train with said corresponding pulse trains to output a combined pulse train at a frequency equal to N times said input clock signal frequency, f) adjusting the duty cycle of said combined pulse train to a 50% duty cycle.

4. A method for 2N times frequency multiplication of a 50% duty cycle input clock signal, comprising the steps of:

a) detecting each transition edge of said input clock signal, and outputting therefrom a first pulse train at a frequency equal to twice that of said input clock signal frequency, with a duty cycle less than 50%, b) splitting said first pulse train into N−1 branches, wherein the duty cycle of each said pulse train branch is adjusted to 1/N, 2/N,...,N−1/N, respectively, where N is an integer>=2, c) detecting each transition edge of said 1/N duty cycle branch, and outputting a second pulse train at a frequency equal to twice that of said 1/N duty cycle branch, d) for N>2, detecting one transition edge per cycle of said 2/N,...,N−1/N duty cycle branches, and outputting a corresponding pulse train for each of said 2/N,...,N−1N duty cycle branches, each said corresponding pulse train having a frequency equal to that of said 2/N,..., N−1/N duty cycle branches, e) combining said second pulse train with said corresponding pulse trains to output a combined pulse train at a frequency equal to 2N times said input clock signal frequency, f) adjusting the duty cycle of said combined pulse train to a 50% duty cycle.

* * * * *